(12) United States Patent
Horio et al.

(10) Patent No.: US 7,141,825 B2
(45) Date of Patent: Nov. 28, 2006

(54) SEMICONDUCTOR LIGHT EMITTING DEVICE CAPABLE OF SUPPRESSING SILVER MIGRATION OF REFLECTION FILM MADE OF SILVER

(75) Inventors: Naochika Horio, Tokyo (JP); Masahiko Tsuchiya, Tokyo (JP); Hitoshi Tamura, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/968,761

(22) Filed: Oct. 19, 2004

(65) Prior Publication Data

US 2005/0211989 A1 Sep. 29, 2005

(30) Foreign Application Priority Data

Mar. 29, 2004 (JP) ............................. 2004-095217

(51) Int. Cl.
*H01L 27/15* (2006.01)
*H01L 29/22* (2006.01)

(52) U.S. Cl. ............................. 257/79; 257/81; 257/79; 257/98; 257/99; 257/E33.072

(58) Field of Classification Search .................. 257/98, 257/99, 81, 79, E33.072
See application file for complete search history.

(56) References Cited

U.S. PATENT DOCUMENTS 5,291,507 A * 3/1994 Haase et al. ............. 372/44.01
5,952,681 A * 9/1999 Chen ........................... 257/89
6,936,859 B1 * 8/2005 Uemura et al. ............... 257/99
2003/0209714 A1 * 11/2003 Taskar et al. .................. 257/79
2005/0200269 A1 * 9/2005 Ng et al. ..................... 313/502

FOREIGN PATENT DOCUMENTS

| JP | 11-220171 A | 8/1999 |
|---|---|---|
| JP | 2003-168823 A | 6/2003 |
| JP | 2003-224297 A | 8/2003 |

OTHER PUBLICATIONS

T. Takemoto et al "High Reliability Micro Soldering Techniques" Kogyou Chousaki Publishing Co. Ltd., Tokyo, Japan; pp. 360-375, Jan. 21, 1991.

* cited by examiner

*Primary Examiner*—Jerome Jackson
*Assistant Examiner*—Joseph Nguyen
(74) *Attorney, Agent, or Firm*—Frishauf, Holtz, Goodman & Chick, PC

(57) ABSTRACT

A luminous lamination structure includes a first layer made of n-type nitride semiconductor and a second layer made of p-type nitride semiconductor and disposed over the first layer wherein a luminous region is defined between the first and second layers. The second layer is removed to expose the first layer in a first area which is a partial surface of the first layer. A p-side electrode is disposed on a surface of the second layer and electrically connected to the second layer. An insulating film covers the p-side electrode. An n-side electrode electrically connected to the first layer is disposed in the first area. A reflection film disposed on the insulating film extends to the n-side electrode and electrically connected to the n-side electrode. The reflection film is made of silver containing alloy or silver.

20 Claims, 13 Drawing Sheets

__US 7,141,825 B2__

SEMICONDUCTOR LIGHT EMITTING DEVICE CAPABLE OF SUPPRESSING SILVER MIGRATION OF REFLECTION FILM MADE OF SILVER

CROSS REFERENCE TO RELATED APPLICATION

This application is based on and claims priority of Japanese Patent Application No. 2004-095217 filed on Mar. 29, 2004, the entire contents of which are incorporated herein by reference.

BACKGROUND OF THE INVENTION

A) Field of the Invention

The present invention relates to a semiconductor light emitting device, and more particularly to a semiconductor light emitting device which uses nitride semiconductor and has positive and negative electrodes disposed on the same side of a substrate.

B) Description of the Related Art

FIG. 15A is a cross sectional view of a semiconductor light emitting device disclosed in Japanese Patent Laid-open Publication No. 2003-224297. On a sapphire substrate 200, a buffer layer 201 is formed. On the buffer layer 201, an n-type contact layer 202 of n-type GaN, an n-type clad layer 203 of n-type AlGaN, a light emitting or luminous layer 204 of InGaN, a p-type clad layer 205 of p-type AlGaN and a p-type contact layer 206 of p-type GaN are stacked in this order. In a partial region, the layers from the p-type contact layer 206 to the surface layer of the n-type contact layer 202 are etched to expose a partial area of the n-type contact layer 202.

A p-side ohmic electrode 207 is formed on the p-type contact layer 206 and an n-side ohmic electrode 208 is formed on the exposed surface of the n-type contact layer 202. The lamination structure of these layers is covered with a translucent insulating film 210. Openings 210$a$ and 210$b$ are formed through the insulating film 210 to expose partial surfaces of the n-side ohmic electrode 208 and p-side ohmic electrodes 207, respectively.

A reflection film 211 is formed on the insulating film 210, covering the p-side ohmic electrode 207. A p-side pad 213 is formed on a partial surface of the reflective film 211, and an n-side pad 212 is formed on the n-side ohmic electrode 208.

The reflection film 211 is made of Al, Ag or Rh and reflects light radiated in the luminous layer 204 toward the substrate 200 side. Light passes through the substrate 200 to be output to an external. In order to improve a light output efficiency, it is desired to increase a reflectance of the reflection film 211. Ag has a very high reflectance in the range from ultraviolet light to visual light. Ag is, however, the metal likely to evolve electrochemical migration. According to "High Reliability Micro Soldering Techniques" by Tadashi TAKEMOTO and Ryouhei SATO (Kogyou Chousakai, Publishing, Co., Ltd), the Ag migration evolution mechanism is described as in the following.

As an electric field is applied under the existence of moisture, Ag is dissolved at the anode and hydrogen ($H_2$) is generated at the cathode. $Ag^+$ ions and $OH^-$ ions react near the anode and silver hydroxide AgOH is formed. Chemically unstable silver hydroxide AgOH is decomposed and colloidal silver oxide $Ag_2O$ is formed. Silver oxide further reacts to form $Ag^+$ ions. These reactions are repeated so that $Ag_2O$ and $Ag^+$ ions move to the cathode, Ag is precipitated and silver grows on the anode dendritically.

As silver migration evolves, silver grown dendritically short-circuits the anode and cathode and leak current increases. Inventions relating to suppressing silver migration are disclosed in Japanese Patent Laid-open Publications Nos. 2003-168823 and HEI-11-220171.

FIG. 15B is a cross sectional view of a semiconductor light emitting device disclosed in Japanese Patent Laid-open Publication No. 2003-168823. On a sapphire substrate 220, an AlN buffer layer 221, an n-type GaN layer 222, an InGaN luminous layer 223 and a p-type GaN layer 224 are stacked in this order. The p-type GaN layer 224 and luminous layer 223 are partially etched to expose a partial area of the n-type GaN layer 222. On the surface of the p-type GaN layer, an Ag layer 225 is formed being covered with a silicon oxide film 227.

A via hole is formed through the silicon oxide film 227 to expose a partial upper surface of the Ag layer 225. An Au layer 228 is formed on the silicon oxide film 227. The Au layer 228 is connected to the Ag layer 225 via the via hole formed through the silicon oxide film 227.

On the exposed surface of the n-type GaN layer 222, an n-side ohmic electrode 226 is formed which has a lamination structure of a V layer and an Al layer. Since the Ag layer 225 is covered with the silicon oxide film 227, Ag migration can be suppressed.

FIG. 15C is a cross sectional view of a semiconductor light emitting device disclosed in Japanese Patent Laid-open Publication No. HEI-11-220171. On a sapphire substrate 230, an AlN buffer layer 231, an n-type GaN layer 232, an n-type GaN clad layer 233, a luminous layer 234, a p-type GaN clad layer 235 and a p-type GaN contact layer 236 are stacked in this order. The lamination structure from the p-type GaN contact layer 236 to n-type GaN clad layer 233 is partially etched to expose a partial area of the n-type GaN layer 232.

An Ag layer 237 is formed on a partial surface of the p-type GaN contact layer 236. The Ag layer 237 is covered with a V layer 238 and an Al layer 239 so that Ag migration can be suppressed.

As disclosed in the above-described Japanese Patent Laid-open Publication No. 2003-168823 and Japanese Patent Laid-open Publication No. HEI-11-220171, Ag migration can be suppressed by covering the Ag layer used as the reflection film and electrode with an insulating film or another metal film. However, this migration suppression effect is not sufficient. It is desired to provide a semiconductor light emitting device capable of effectively suppress Ag migration.

SUMMARY OF THE INVENTION

An object of this invention is to provide a semiconductor light emitting device capable of suppressing migration and improving reliability although it uses the metal likely to evolve migration.

According to one aspect of the present invention, there is provided a semiconductor light emitting device comprising: a luminous lamination structure including a first layer made of n-type nitride semiconductor and a second layer made of p-type nitride semiconductor and disposed over the first layer wherein a luminous region is defined between the first and second layers and the second layer is removed to expose the first layer in a first area which is a partial surface of the first layer; a p-side electrode disposed on a surface of the second layer and electrically connected to the second layer;

an insulating film covering the p-side electrode; an n-side electrode electrically connected to the first layer in the first area; and a reflection film disposed on the insulating film, extending to the n-side electrode, electrically connected to the n-side electrode, and made of silver containing alloy or silver.

The reflection film may be made in an electrically floating state.

The reflection film is connected to the n-side electrode, i.e., cathode. It is therefore possible to suppress ionization of metal constituting the reflection film and suppress the generation of migration.

DESCRIPTION OF THE PREFERRED EMBODIMENTS

Figure 1A:
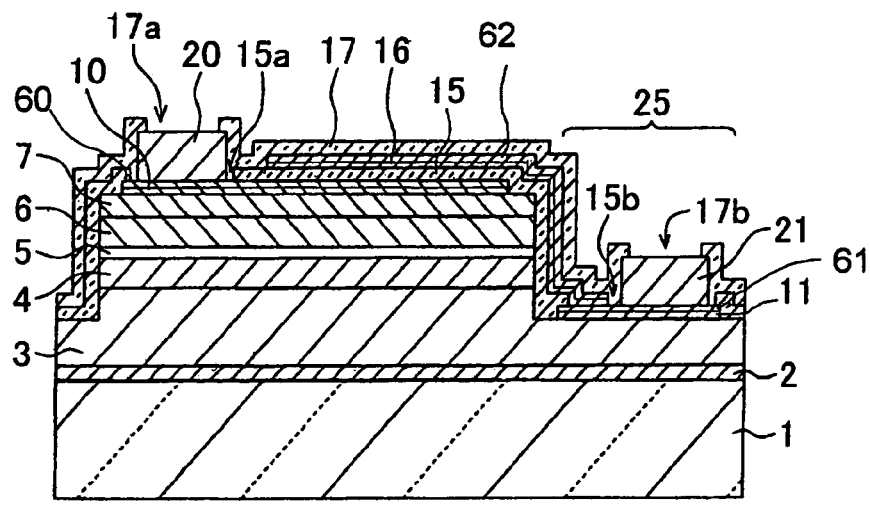
FIG. 1A is a cross sectional view of a semiconductor light emitting device according to a first embodiment.
Figure 1B:
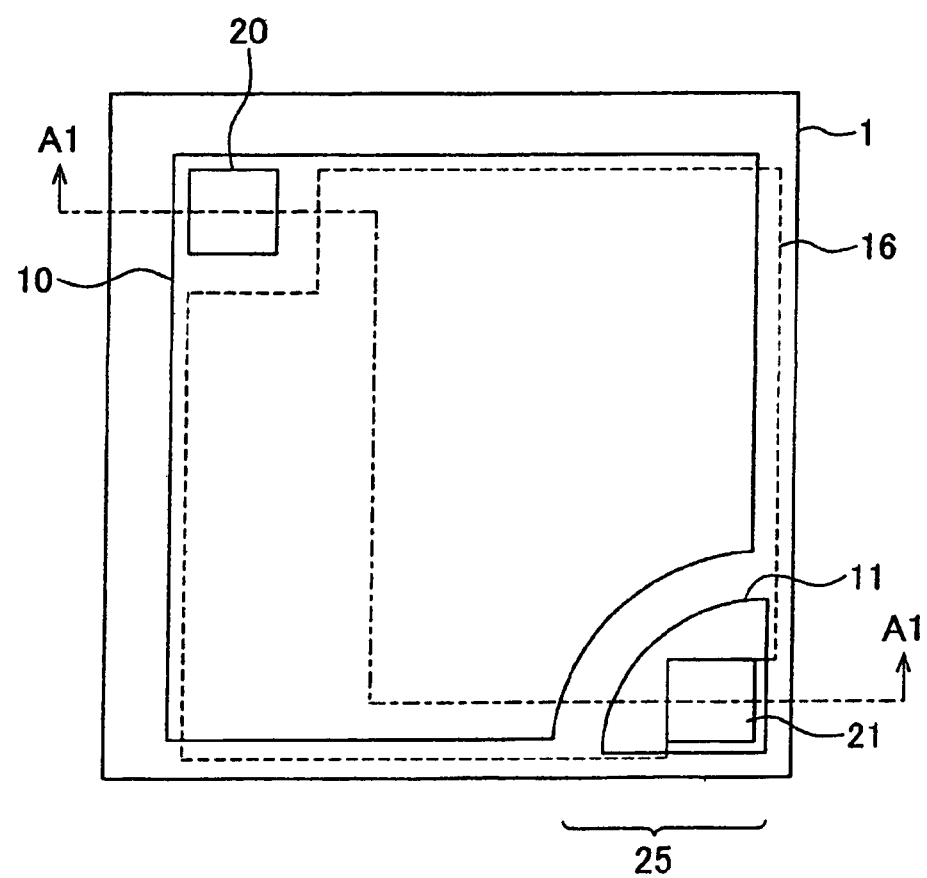
FIG. 1B is a plan view of the semiconductor light emitting device the first embodiment.

FIG. 1A is a cross sectional view of a semiconductor light emitting device according to the first embodiment, and FIG. 1B is a plan view of the device shown in FIG. 1A. A cross sectional view taken along one-dot chain line A1—A1 shown in FIG. 1B corresponds to FIG. 1A. On an underlying substrate 1 made of sapphire, an initial nucleus forming layer 2, an n-type contact layer 3, an n-type clad layer 4, a luminous layer 5, a p-type clad layer 6, a p-type contact layer 7 are stacked in this order. These layers are made of nitride compound semiconductor such as $In_xAl_yGa_zN$ (x+y+z=1).

In a first area 25 of a partial substrate in-plane, the layers from the p-type contact layer 7 to a surface layer of the n-type contact layer 3 are etched to partially expose the n-type contact layer 3.

A p-side ohmic electrode 10 is formed on the p-type contact layer 7. The p-side ohmic electrode 10 is made of platinum (Pt) and has a thickness of about 5 nm. An n-side ohmic electrode 11 is formed on the surface of the n-type contact layer 3 in the first area 25. The n-side ohmic electrode 11 has a two-layer structure of an Al layer having a thickness of about 3 nm and a rhodium (Rh) layer having a thickness of about 100 nm. The p-side ohmic electrode 10 and n-side ohmic electrode 11 are in ohmic contact with the p-type contact layer 7 and n-type contact layer 3, respectively.

Adhesion layers 60 and 61 made of Ti, Ni, W, Mo or the like and each having a thickness of 0.3 nm to 3 nm are formed on the p-side ohmic electrode 10 and n-side ohmic electrode 11, respectively. The adhesion layers can improve adhesion to an insulating film 15 deposited on the adhesion layers.

The insulating film 15 is formed on the substrate, covering the p-side ohmic electrode 10 and n-side ohmic electrode 11. For example, the insulating film 15 is made of silicon oxide and has a thickness of about 300 nm. Openings 15a and 15b are formed through the insulating film 15. A partial surface of the p-side ohmic electrode 10 is exposed on the bottom of the opening 15a, and a partial surface of the n-side ohmic electrode 11 is exposed on the bottom of the opening 15b.

A reflection film 16 is formed on the insulating film 15. The reflection film 16 extends from the area superposed upon the p-side ohmic electrode 10 to the upper surface of the n-side ohmic electrode 11 in the first area 25, and is electrically connected to the n-side ohmic electrode 11 exposed on the bottom of the opening 15b. The reflection film 16 is made of silver (Ag) and has a thickness of about 200 nm.

An adhesion layer (not shown) made of Ti, Ni, Al, W, Mo or the like and having a thickness of 0.3 nm to 3 nm is inserted between the insulating film 15 and reflection film 16. This adhesion layer improves adhesion properties between the insulating film 15 and reflection film 16. A similar adhesion layer 62 is formed also on the reflection film 16. This adhesion layer 62 improves adhesion to a protective film 17 to be formed thereon. The upper adhesion layer 62 has a thickness of, for example, 10 nm.

A p-side pad electrode 20 is formed on the p-side ohmic electrode 10 exposed on the bottom of the opening 15a, and an n-side pad electrode 21 is formed on the n-side ohmic electrode 11 exposed on the bottom of the opening 15b. The p-side pad electrode 20 and n-side pad electrode 21 have a multi-layer structure of $Ti/Pt/Au/(Pt/Au)_n$ where n is the number of repetitions of two layers of a Pt layer and an Au layer. A thickness of the lowermost Ti layer is, for example, 3 nm and a thickness of each of the Pt layer and Au layer is, for example, 100 nm. The number of repetitions is, for example, 2. The number n of repetitions is preferably 1 to 5 from the viewpoint of film forming works and an amount of material to be used. If flip chip bonding is to be performed, it is preferable to set a thickness of the third Au layer of the n-side pad electrode 21 as measured from the substrate side to 100 nm to 1000 nm to make the upper surface height of the n-side pad electrode 21 be flush with the upper surface height of the p-side pad electrode 20.

An adhesion layer (not shown) made of Ti, Ni, Al, W, Mo or the like and having a thickness of 0.3 nm to 3 nm is formed on the p-side pad electrode 20 and n-side pad electrode 21. This adhesion layer improves adhesion to a protective film 17 to be deposited thereon.

The protective film 17 is formed covering the reflection film 16 and pad electrodes 20 and 21. The protective film 17 is made of silicon oxide and has a thickness of 100 nm to 300 nm, preferably about 200 nm. Openings 17a and 17b are formed through the protective film 17. The upper surfaces of the p-side pad electrode 20 and n-side pad electrode 21 are exposed on the bottoms of the openings 17a and 17b, respectively.

As shown in FIG. 1B, the plan shape of one semiconductor light emitting device is, for example, a square having one side length of 300 µm. The first area 25 contains one vertex of the square and is constituted of an area near this vertex. For example, the shape of the first area is a sector shape having a center angle of 90° around one vertex. The p-side ohmic electrode 10 is disposed in an area excluding the first area 25 and occupies most of the surface of the semiconductor light emitting device. The p-side pad electrode 20 is disposed in an area near the diagonally opposite vertex to the vertex contained in the first area 25. The reflection film 16 occupies most of the surface of the semiconductor light emitting device excluding the area where the p-side pad electrode 20 is disposed.

Next, description will be made on a method of manufacturing the semiconductor light emitting device of the first embodiment. Each of the layers from the initial nucleus forming layer 2 to the p-type contact layer 7 formed on the underlying substrate 1 made of sapphire is formed, for example, metal organic vapor phase epitaxial (MOVPE) growth, molecular beam epitaxial (MBE) growth or the like. After the p-type contact layer 7 is formed, the surface of the substrate is washed, and the p-side ohmic electrode 10 and the adhesion layer thereon are formed by electron beam vacuum deposition and lift-off.

By using as a mask a resist pattern having an opening corresponding to the first area 25, etching is performed down to the surface layer region of the n-type contact layer 3 by reactive ion etching to partially expose the n-type contact layer 3. After etching, the resist pattern used as the mask is removed. On the exposed surface of the n-type contact layer 3, the n-side ohmic electrode 11 is formed by electron beam vacuum deposition and lift-off.

The p-side ohmic electrode 10 and n-side ohmic electrode 11 may be formed after the surface of the n-type contact layer 3 is partially exposed.

The insulating film 15 is formed by sputtering. The openings 15a and 15b are formed through the insulating film 15. The openings 15a and 15b may be formed by lift-off. The lower adhesion layer, reflection film 16 and upper adhesion layer are formed by electron beam vacuum deposition and lift-off. In order not to short-circuit the reflection film 16 and the p-side ohmic electrode 10 exposed on the bottom of the opening 15a, the boundary of the reflection film 16 is retracted from the boundary of the opening 15a by 1 µm or longer, preferably by about 5 µm. In order to electrically connect the n-side ohmic electrode 11 exposed on the bottom of the opening 15b, an overlap width of about 3 µm to 5 µm is retained between the reflection film 16 and opening 15b. In this manner, the reflection film 16 is not connected to the p-side ohmic electrode 10, but is electrically connected to the n-side ohmic electrode 11.

The p-side pad electrode 20, n-side pad electrode 21 and adhesion layers thereon are formed by electron beam vacuum deposition and lift-off. The p-side pad electrode 20 is preferably formed in such a manner that the outer periphery thereof is disposed slightly inner than the boundary of the opening 15a. If the p-side pad electrode 20 does not contact the reflection film 16, the area near the outer periphery of the p-side pad electrode 20 may overlap the insulating film 15.

The protective film 17 is formed by sputtering. Thereafter, the openings 17a and 17b are formed through the protective film 17. The openings 17a and 17b may be formed by lift-off. The surface of the p-side pad electrode 20 is exposed on the bottom of the opening 17a, and the n-side pad electrode 21 is exposed on the bottom of the opening 17b.

The bottom surface of the underlying substrate 1 is ground and polished to thin the thickness of the underlying substrate 1 µm to about 100 µm. The thickness of the underlying substrate 1 may be 60 µm to 210 µm. Scribing and breaking are performed to separate the wafer into light emitting devices. Each separated light emitting device can be used in various application fields. For example, the separated light emitting device is flip-chip-bonded to a sub-mount substrate. The underlying substrate 1 may be adhered to a light guiding plate by transparent adhesive, and the p-side pad electrode 20 and n-side pad electrode 21 are connected to wiring lines formed on the light guiding plate by gold wires.

As a forward voltage is applied to the lamination structure constituted of the n-type clad layer 4, luminous layer 5 and p-type clad layer 6, light is radiated in the luminous layer 5. Light radiated in the luminous layer 5 passes through the underlying substrate 1 and is irradiated to an external. Light radiated in the luminous layer 5 and propagated toward the p-type clad layer 6 passes through the p-side ohmic electrode 10 and insulating film 15, is reflected by the reflection film 16 toward the underlying substrate 1, passes through the underlying substrate 1 and is irradiated to the external.

Ag migration may be ascribed to that Ag is dissolved at the anode when an electric field is applied under the existence of moisture. In the above-described first embodiment, since the reflection film 16 made of Ag is connected to the cathode (n-side ohmic electrode 11), Ag will not be dissolved so that Ag migration can be suppressed.

Figure 2:
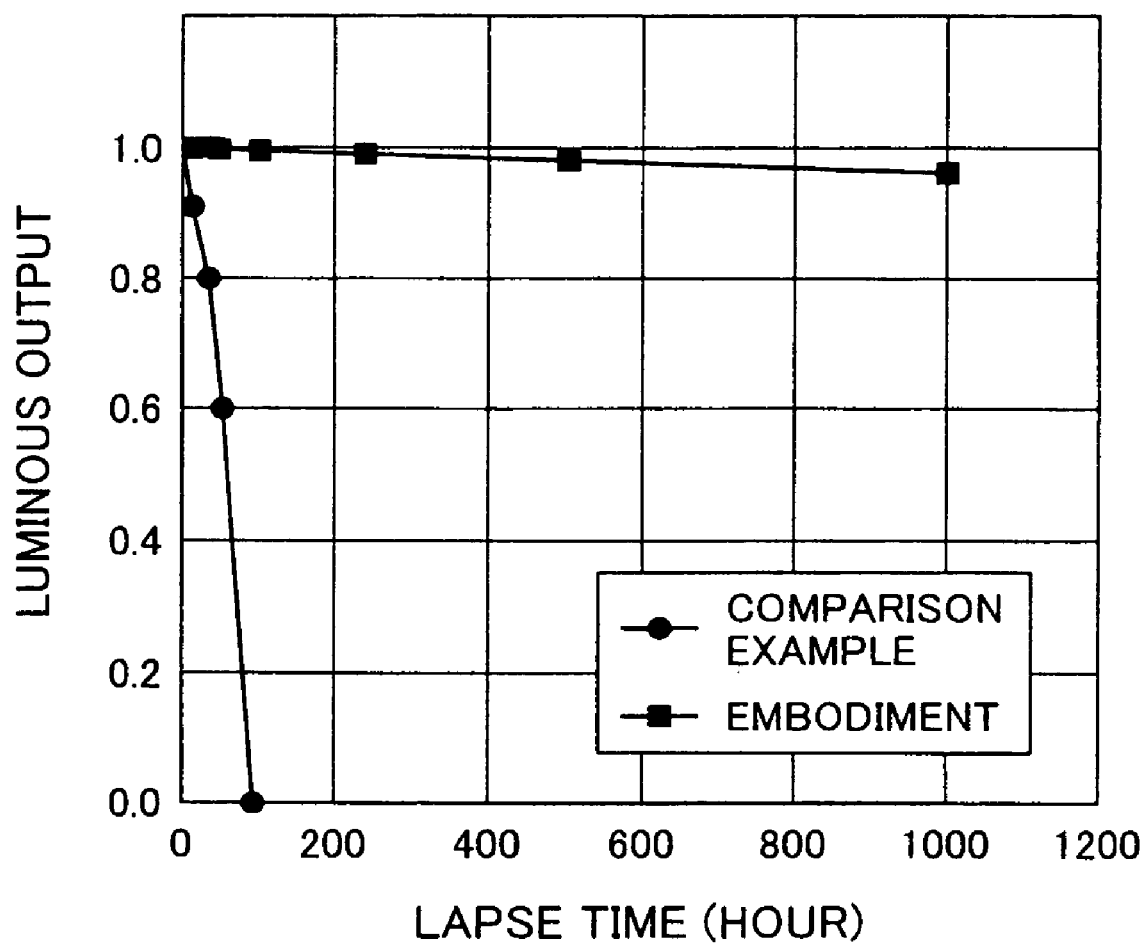
FIG. 2 is a graph showing the lifetime of the semiconductor light emitting device of the first embodiment, as compared to the lifetime of a device of a comparative example.

FIG. 2 shows the result of a lifetime evaluation test of the semiconductor light emitting device of the first embodiment. The abscissa represents a lapse time in the unit of "hour" and the ordinate represents a luminous output indicated by a relative scale. As a comparative example, the result of the lifetime evaluation test of a semiconductor light emitting device is shown, the device having the structure that the p-side ohmic electrode 10 shown in FIG. 1A is made of Ag and used as the reflection film. A black rectangle symbol in FIG. 2 shows a change with time of the luminous output of the semiconductor light emitting device of the first embodiment, and a black circle symbol shows a change with time of the luminous output of the semiconductor light emitting device of the comparative example. The lifetime evaluation test measured a luminous output in the atmospheric air while the semiconductor light emitting device is flip-chip-bonded to a sub-mount substrate. The luminescence wavelength was 405 nm.

The luminous output of the semiconductor light emitting device of the comparative example abruptly lowers in several tens hours, whereas the luminous output of the semiconductor light emitting device of the embodiment hardly lowers even after the lapse of 1000 hours. By connecting the reflection film 16 made of Ag to the cathode, the semiconductor light emitting device can have a long lifetime.

In the above-described first embodiment, although the p-side ohmic electrode 10 is made of Pt, it may be made of a different conductive material which allows light in the luminescence wavelength range of the luminous layer 5 to transmit and can have an ohmic contact with the p-side contact layer 7. Such materials may be rhodium (Rh), palladium (Pd) and the like. A two-layer structure of a Pt layer and an Rh layer or a two-layer structure of an Ni layer and an Au layer may also be adopted. If a two-layer structure of an Ni layer and an Au layer is used, an annealing process is required to be performed after the layers are formed in order to obtain an ohmic contact. A translucent oxide film made of oxide of Au and Ni may be used. In this case, after the layer is formed, an annealing process in an oxidizing atmosphere is required to be performed.

In the above-described first embodiment, although the n-side ohmic electrode 11 has the two-layer structure of an Al layer and an Rh layer (Al/Rh structure), a different structure capable of obtaining an ohmic contact with the n-side contact layer 3 may be used. For example, usable structures include an Al/Pt structure, an Al/Ir structure, an Al/Pd structure, a Ti/Al structure and a V/Al structure. If the Ti/Al structure or V/Al structure is adopted, an annealing process is necessary after the layers are formed, in order to obtain an ohmic contact.

In the first embodiment, although the insulating film 15 is made of silicon oxide, it may be made of different insulating material which allows light in the radiation range of the luminous layer 5 to transmit. For example, usable materials of the insulating film may be oxide such as titanium oxide ($TiO_2$), tantalum oxide ($Ta_2O_5$), alumina ($Al_2O_3$), zirconium oxide ($ZrO_2$) and hafnium oxide ($HfO_2$), heat resistant organic polymeric material such as polyimide, and the like.

In the first embodiment, although the p-side pad electrode 20 has the multi-layer structure of $Ti/Pt/Au/(Pt/Au)_n$, it may have a different multi-layer structure such as $Ti/Rh/Au/(Pt/Au)_n$ and $Ni/Rh/Au/(Pt/Au)_n$. A thickness of the lower most layer of the Ti or Ni layer is set to, for example, 0.3 nm to 1 nm. A thickness of each of upper Rh, Pt and Au layers is set to 100 nm. The number n of repetitions is set to 1 to 5. The multi-layer structure satisfying these conditions allows the p-side pad electrode 20 to present the function of the reflection film, and improves the light output efficiency.

In the first embodiment, although the reflection film 16 is made of Ag, it may be made of alloy which contains Ag as a main composition. A thickness of the reflection film 16 is preferably set to 80 nm or thicker in order not to allow light radiated in the luminous layer 5 to transmit. Even if the reflection film 16 is made of the metal other than Ag likely to invoke migration, the migration suppression effect can be expected. This embodiment is particularly effective when the reflection film 16 is made of the metal likely to invoke migration more than the p-side ohmic electrode 10.

In the first embodiment, although the protective film 17 is made of silicon oxide, it may be made of different insulating material. For example, usable materials of the insulating film may be oxide such as titanium oxide ($TiO_2$), tantalum oxide ($Ta_2O_5$), alumina ($Al_2O_3$), zirconium oxide ($ZrO_2$) and hafnium oxide ($HfO_2$), heat resistant organic polymeric material such as polyimide, and the like.

Figure 16:
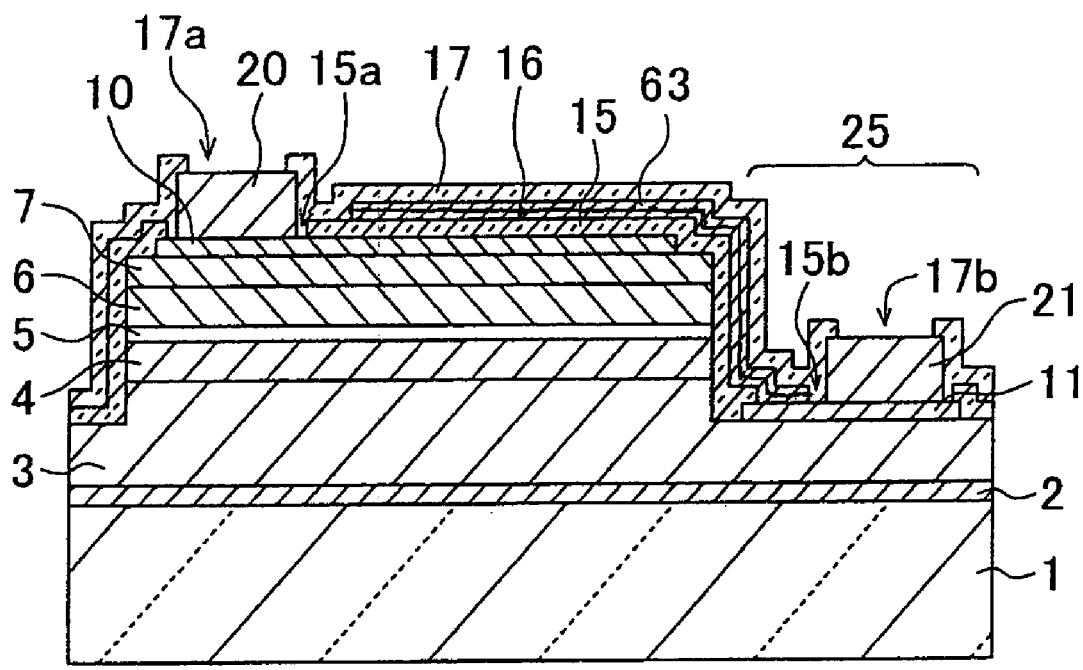
FIG. 16 is a cross-sectional view of a semiconductor light emitting device including a conductive layer formed on a surface of the reflection film.

As shown in FIG. 16, a conductive layer 63, which is made of metal such as Al having a larger ionization tendency than Ag, may be formed on a surface of the reflection film 16. By using a junction between different metals having a difference between ionization tendencies, electric corrosion of the reflection film 16 can be suppressed even under the condition that electricity is applied between the electrodes.

In the first embodiment, the p-side ohmic electrode 10, insulating film 15 and reflection film 16 constitute the multi-layer reflection film. The reflectance is dependent upon the thicknesses of these films. It is difficult to determine from experiments the conditions suitable for raising the reflectance of the multi-layer film constituted of a metal thin film and a dielectric film. Therefore, the film thickness dependency of a reflectance of a multi-layer reflection film was evaluated by simulation. The evaluation result by simulation will be described hereinunder.

Figure 3:
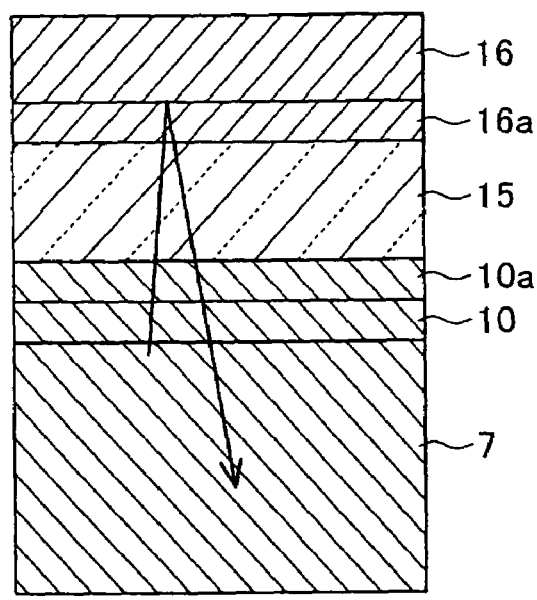
FIG. 3 is a cross sectional view of a lamination structure model underwent reflectance simulation.

FIG. 3 shows a model of a multi-layer reflection film used by simulation. On a contact layer 7 made of GaN, a p-side ohmic electrode 10 of Pt, an adhesion layer 10a of Ti, an insulating film 15 of $SiO_2$, an adhesion layer 16a of Ti and a reflection film 16 of Ag are stacked in this order. A reflectance of light having a wavelength of 460 nm and propagating from the contact layer 7 to the reflection film 16 was obtained by simulation.

Figure 4:
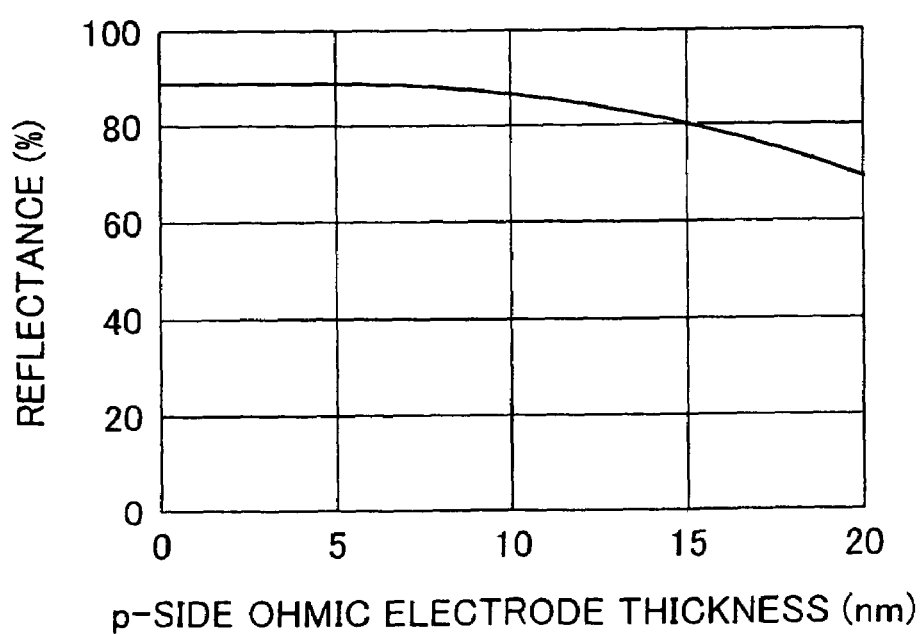
FIG. 4 is a graph showing the relation between a p-side ohmic electrode thickness and a reflectance.

FIG. 4 shows the relation between a thickness of the p-side ohmic electrode 10 and a reflectance. The abscissa represents a thickness of the p-side ohmic electrode 10 in the unit of "nm" and the ordinate represents a reflectance in the unit of "%". The thicknesses of the adhesion layer 10a, insulating film 15, adhesion layer 16a and reflection film 16 were set to 0.3 nm, 285 nm, 0.3 nm and 200 nm, respectively. The reflectance is hardly influenced by the film thickness in the film thickness range equal to or thinner than 7 nm of the p-side ohmic electrode 10. In the film thickness range equal to or thicker than 7 nm, the reflectance lowers as the film thickness increases.

Figure 5:
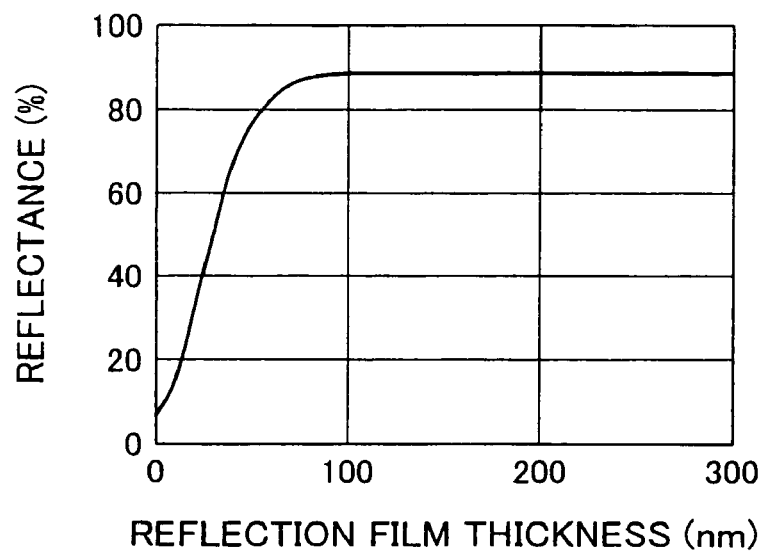
FIG. 5 is a graph showing the relation between an insulating film thickness and a reflectance.

FIG. 5 shows the relation between a thickness of the reflection film 16 and a reflectance. The abscissa represents a thickness of the reflection film 16 in the unit of "nm" and the ordinate represents a reflectance in the unit of "%". The thicknesses of the p-side ohmic electrode 10, adhesion layer 10a, insulating film 15 and adhesion layer 16a were set to 5 nm, 0.3 nm, 285 nm and 0.3 nm, respectively. It can be understood that as the reflection film 16 becomes thick, the reflectance increases and the reflectance saturates at a film thickness of near 80 nm. It can be understood from this result that the thickness of the reflection film 16 is preferably set to 80 nm or thicker.

Figure 6:
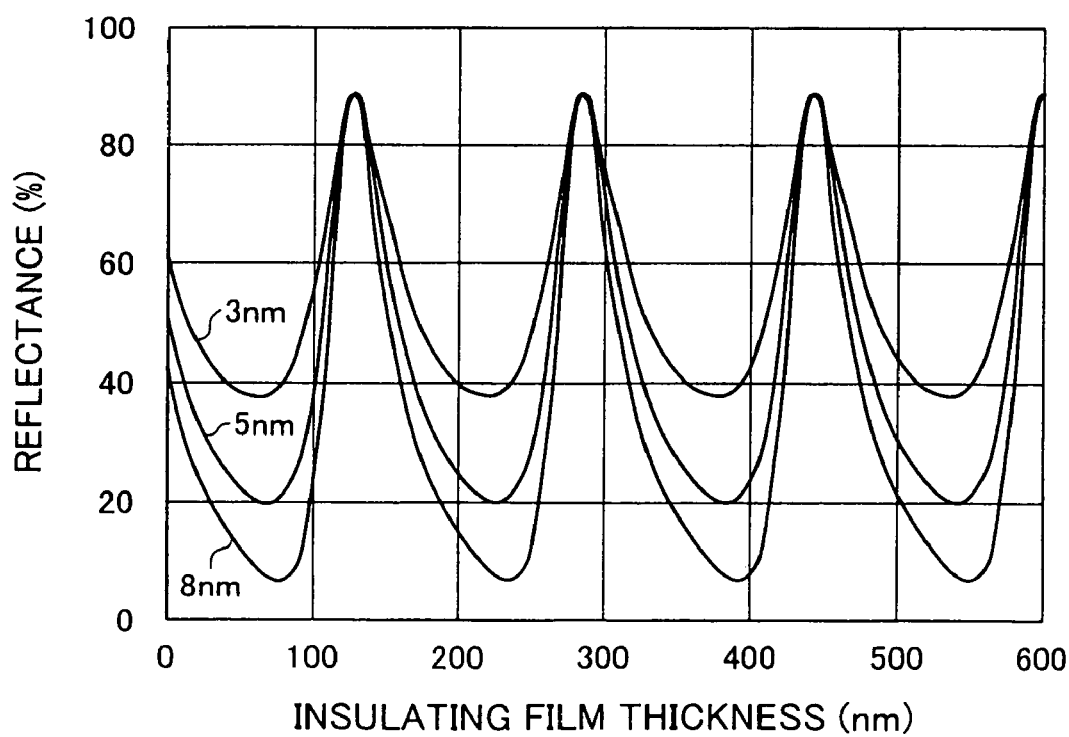
FIG. 6 is a graph showing the relation between an insulating film thickness and a reflectance, at each thickness of a p-side ohmic electrode.

FIG. 6 shows the relation between a thickness of the insulating film 15 and a reflectance. The abscissa represents a thickness of the insulating film 15 in the unit of "nm" and the ordinate represents a reflectance in the unit of "%". The thicknesses of the adhesion layer 10a, adhesion layer 16a and reflection film 16 were set to 0.3 nm, 0.3 nm and 200 nm, respectively. Three curves in FIG. 6 show reflectances at the thicknesses of 3 nm, 5 nm and 8 nm of the p-side ohmic electrode 10. The reflectance changes periodically in accordance with a change in the thickness of the insulating film 15. The reflectance takes maximum values at the thicknesses of the insulating film 15 near about 130 nm, 286 nm and 440 nm.

It can be seen that the reflectance at the minimum value lowers as the p-side ohmic electrode 10 becomes thicker. In order to suppress a lower reflectance when the thickness of the insulating film 15 varies, it is preferable that the p-side ohmic electrode 10 is made thin. If the p-side ohmic electrode is made too thin, it is not possible to achieve the primary object of the electrode that carriers should be injected uniformly into the p-type contact layer 7. In order to meet the requirements of both a high reflectance and a uniform carrier injection, the thickness of the p-side ohmic electrode 10 is preferably set to 1 nm to 15 nm and more preferably to 3 nm to 8 nm. The thickness of the p-side ohmic electrode 10 may be thinned to 1 nm to 5 nm and a mesh type auxiliary electrode of Pt or Rh may be formed on the p-side ohmic electrode. For example, a width of one electrode constituting the mesh is set to 2 µm to 5 µm, and a distance between electrodes is set to 10 µm to 15 µm.

The measured reflectance of an actually formed evaluation sample had a maximum value at a thickness of near 300 nm of the insulating film 15, although simulation indicates a maximum reflectance at a thickness of about 286 nm of the insulating film 15. A shift of the optimum film thickness of the insulating film 15 obtained by experiments from the optimum film thickness of the insulating film 15 obtained by simulation may be ascribed to that the optical characteristics of each film used by simulation do not correctly coincide with the optical characteristics of each film actually formed. From the viewpoint of guarantee of insulating properties, etching time and the like, the thickness of the insulating film 15 is preferably set to 100 nm to 600 nm and more preferably to 200 nm to 400 nm.

Figure 7:
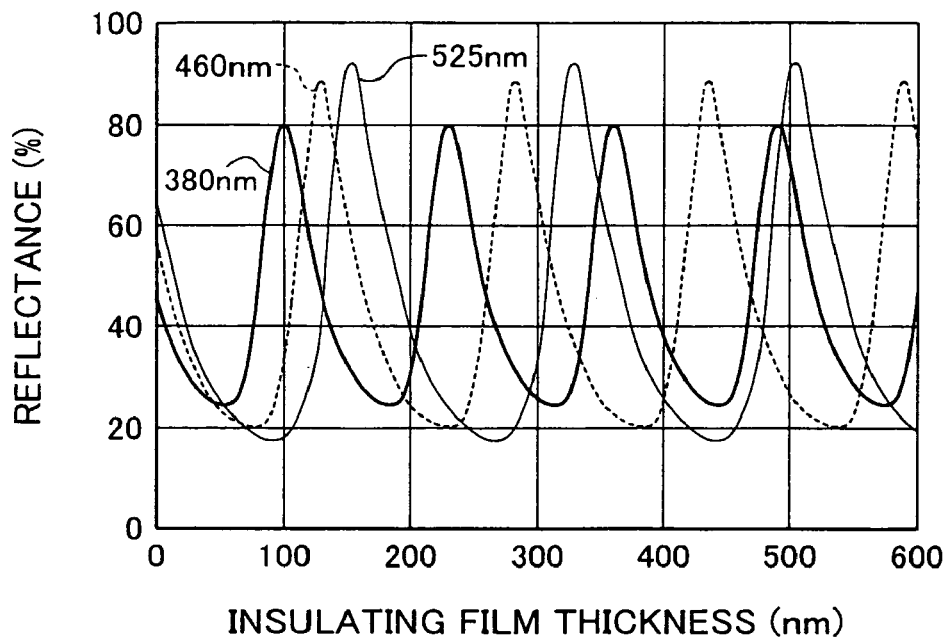
FIG. 7 is a graph showing the relation between an insulating film thickness and a reflectance, at each wavelength.
Figure 8:
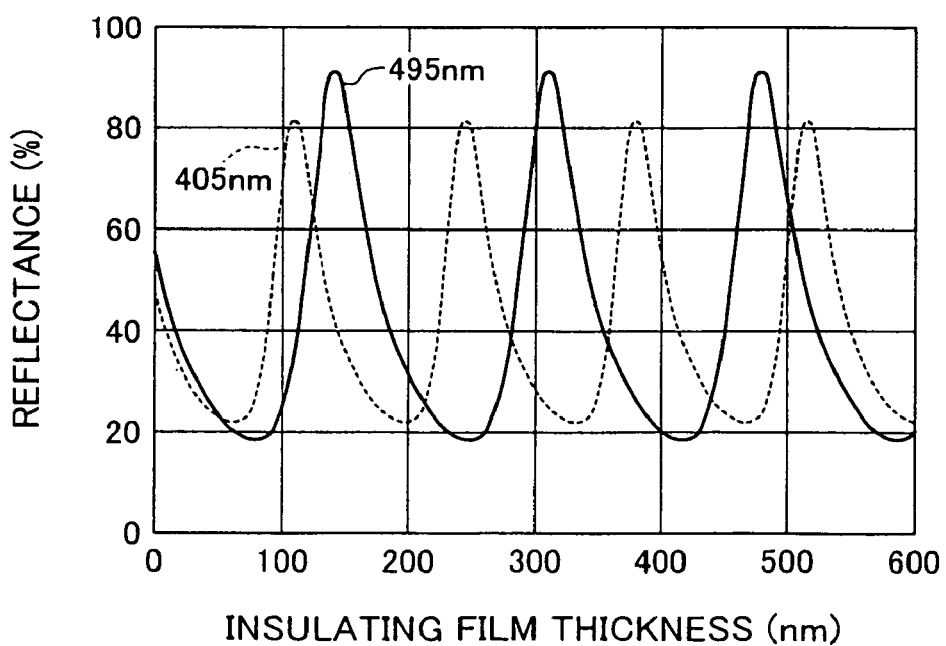
FIG. 8 is a graph showing the relation between an insulating film thickness and a reflectance, at each wavelength.

FIGS. 7 and 8 show the relation between a thickness of the insulating film 15 and a reflectance, at different wavelengths. The abscissa represents a thickness of the insulating film in the unit of "nm" and the ordinate represents a reflectance in the unit of "%". The thicknesses of the p-side ohmic electrode 10, adhesion layer 10a, adhesion layer 16a and reflection film 16 were set to 5 nm, 0.3 nm, 0.3 nm and 200 nm, respectively. A numerical number added to each of a plurality of curves shown in FIGS. 7 and 8 indicates the wavelength of light to be reflected.

As the wavelength of light to be reflected changes, the thickness of the insulating film 15 at the maximum reflectance changes. It is preferable to set the thickness of the insulating film 15 near to a thickness providing the maximum reflectance, in accordance with the wavelength of light radiated in the luminous layer.

The film thickness conditions for increasing the reflectance have been obtained through simulation. In an actual case, the refractive index and attenuation coefficient of each film change more or less depending upon a film forming method. The reflectance is also influenced by a surface roughness of a film. It is therefore preferable to determine an optimum film thickness of each film, by forming a plurality of evaluation samples having different film thicknesses by referring to the optimum film thickness and by measuring actual reflectances. The simulation results can be used as the criterion of determining a thickness of each film of the evaluation sample.

Next, description will be made on the measurement results of the reflectance of each of evaluation samples actually formed. For each evaluation sample, a sapphire substrate having a thickness of 320 µm was used as the p-side contact layer 7 shown in FIG. 3. Pt films having thicknesses of 5 nm, 8 nm and 10 nm were used as the p-side ohmic electrode 10. A Ti film having a thickness of 0.3 nm was used as the adhesion layers 10a and 16a. An SiO$_2$ film having a thickness of 313 nm was used as the insulating film 15. An Ag film having a thickness of 200 nm was used as the reflection film 16.

As a GaN film having a thickness of about 4 µm to 8 µm is formed on the sapphire substrate, a warp is formed on the substrate. As the warp is formed on the substrate, it is not possible to correctly adjust the incidence angle of incidence light to be used for measuring a reflectance. From this reason, a sapphire substrate not formed with a GaN layer was used as the measurement sample.

Figure 9:
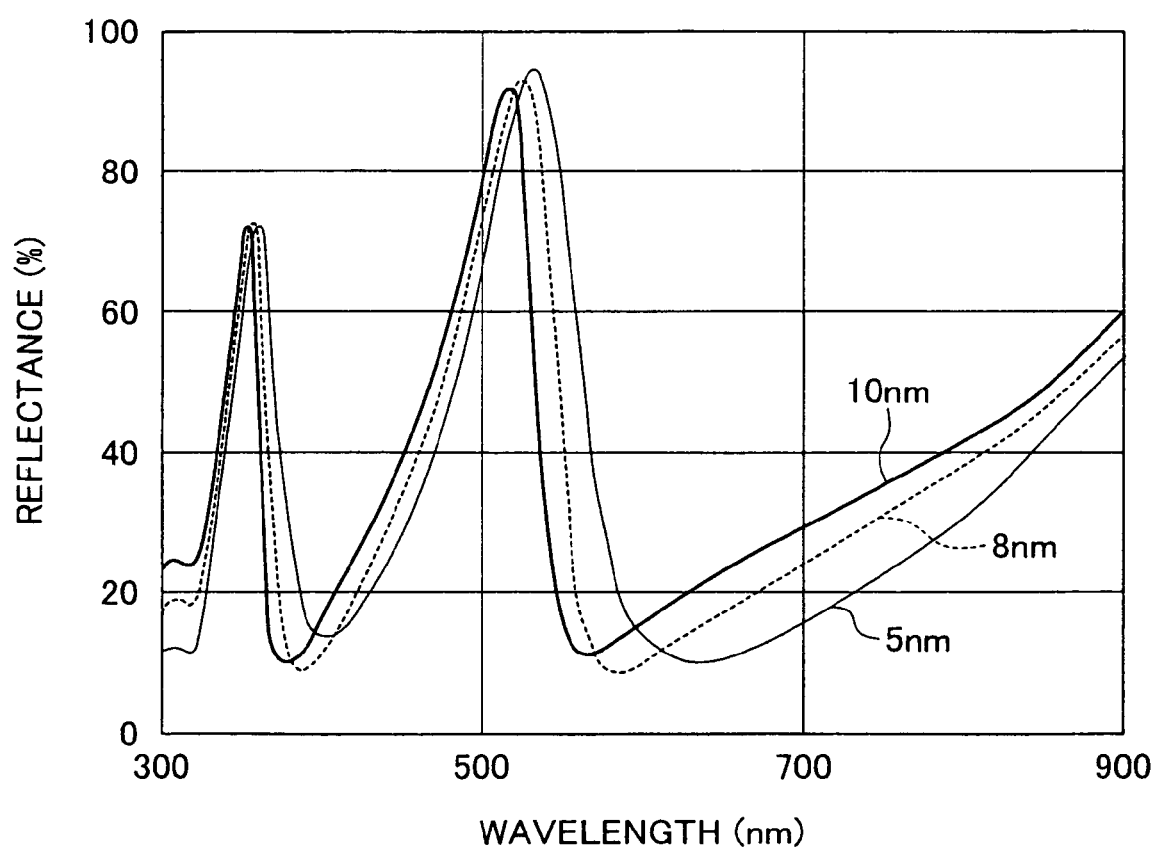
FIG. 9 is a graph showing the relation between a wavelength and a reflectance, at each thickness of a p-side ohmic electrode.

FIG. 9 shows the measurement results of reflectances. The abscissa represents a wavelength in the unit of "nm" and the ordinate represents a reflectance in the unit of "%". The samples actually formed had maximum reflectances in the wavelength range of 350 nm to 360 nm and in the wavelength range of 510 nm to 520 nm. By measuring reflectances of various samples actually formed, it is possible to obtain the relation between the reflectance of a multi-layer reflection film formed on the sapphire substrate and the reflectance of a multi-layer reflection film formed on the GaN layer. By utilizing this relation, an optimum film thickness of the insulating film 15 can be estimated.

Next, with reference to FIGS. 10 and 11, a semiconductor light emitting device of the second embodiment will be described.

Figure 10:
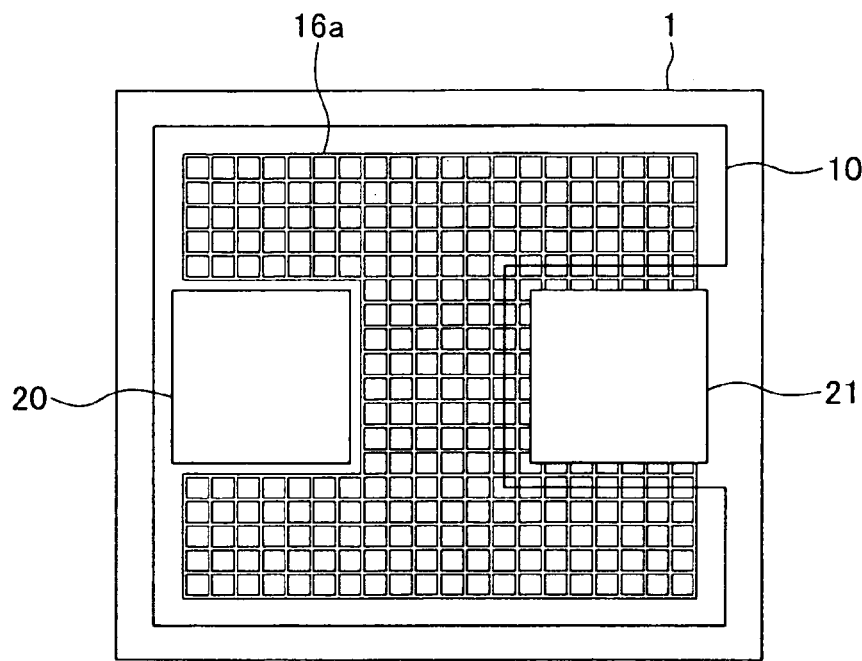
FIG. 10 is a plan view of a semiconductor light emitting device according to a second embodiment.

FIG. 10 is a plan view of a semiconductor light emitting device of the second embodiment. In the first embodiment shown in FIG. 1B, the reflection film 16 is made of a plain film and superposes most area of the p-side ohmic electrode 10. In the second embodiment, in place of the reflection film 16, a reflection pattern 16a of a grid shape is disposed. The other fundamental structure is similar to that of the semiconductor light emitting device of the first embodiment. In the example shown in FIG. 10, although a p-side pad electrode 20 and an n-side pad electrode 21 are disposed slightly inside of the central area of a pair of opposing sides of a rectangle, they may be disposed near at the vertexes of the rectangle as in the case of the first embodiment shown in FIG. 1B.

In the semiconductor light emitting device of the second embodiment, light radiated in the luminous layer is irradiated to an external via the support substrate and to the side opposite to the support substrate via openings of the reflection pattern 16a. Light is also scattered by the reflection pattern 16a and irradiated to the side of the semiconductor light emitting device.

Figure 11:
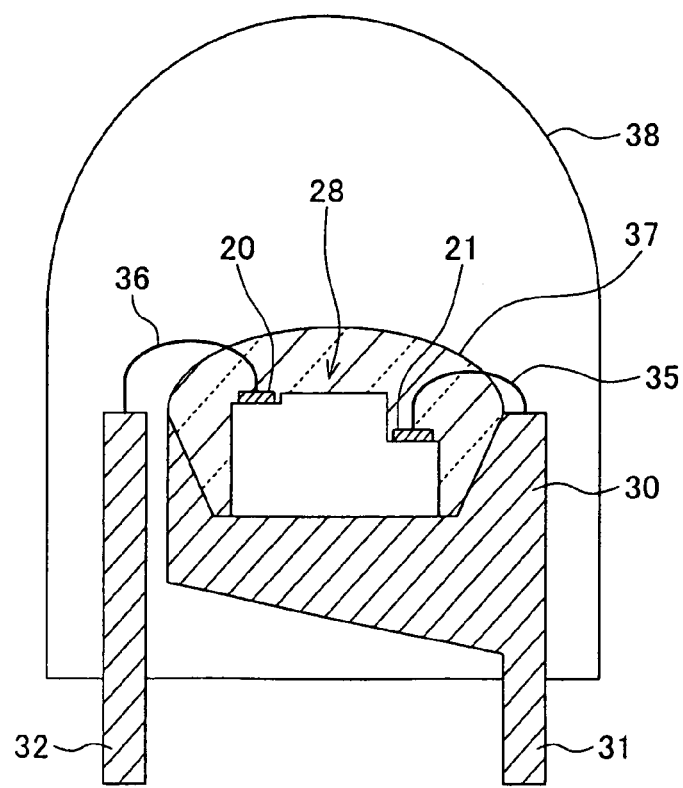
FIG. 11 is a schematic cross sectional view of a lamp having the semiconductor light emitting device of the second embodiment built therein.

FIG. 11 is a schematic cross sectional view of a lamp having the semiconductor light emitting device of the second embodiment built therein. On the bottom of a recess of a metal frame 30, the semiconductor light emitting device 28 shown in FIG. 10 is mounted with the support substrate directed to the frame side. A cathode lead 31 extends from the frame 30. An n-side pad electrode 21 of the semiconductor light emitting device 28 is connected to the frame 30 via a gold wire 35. The p-side pad electrode 20 is connected to an anode lead 32 via a gold wire 36.

The fluorescent member 37 buries the recess of the frame 30. The semiconductor light emitting device 28 is covered with the fluorescent member 37. The frame 30, cathode lead 31 and anode lead 32 are molded with sealing resin 38.

Light irradiated toward the lower portion of the semiconductor light emitting device 28 (on the side of the support substrate) is reflected by the frame 30 and becomes incident upon the fluorescent member 37. Light irradiated toward the side and upper portions of the semiconductor light emitting device 28 (on the side opposite to the support substrate) becomes also incident upon the fluorescent member 37.

Upon reception of light, the fluorescent member 37 radiates fluorescence which is irradiated to the outside of the resin mold 38.

Since light is irradiated toward the lower, side and upper portions of the semiconductor light emitting device 28, it is possible to alleviate color shade.

In the second embodiment, although the reflection pattern 16a of the grid shape is used, another pattern having openings and scattering light may be used. For example, a stripe pattern, a honeycomb pattern or the like may be used.

Next, with reference to FIGS. 12A and 12B and FIG. 13, a semiconductor light emitting device of the third embodiment will be described.

Figure 12A:
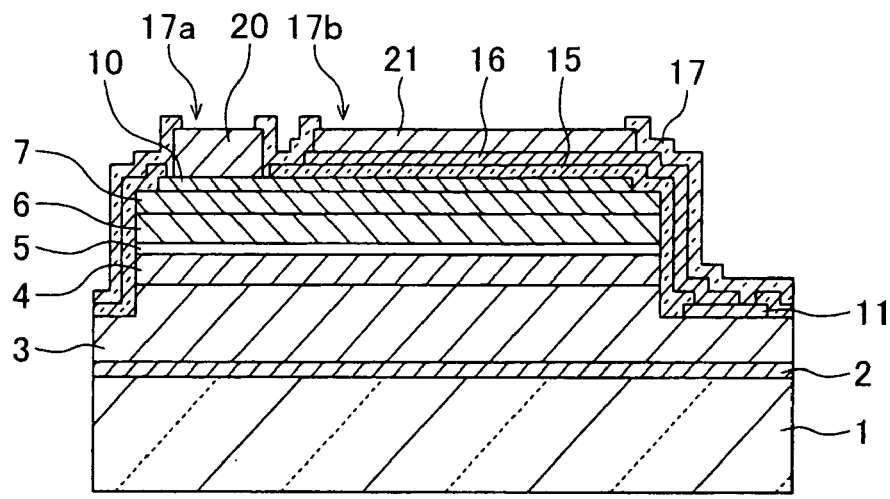
FIG. 12A is a cross sectional view of a semiconductor light emitting device according to a third embodiment.
Figure 12B:
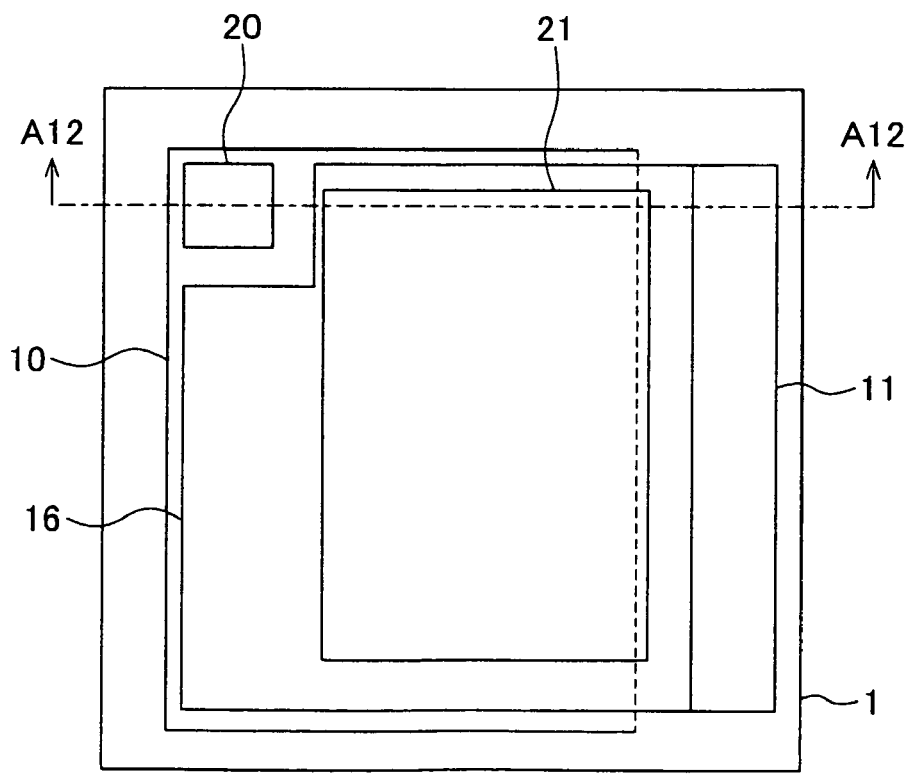
FIG. 12B is a plan view of the light emitting device of the third embodiment.

FIG. 12A is a cross sectional view of the semiconductor light emitting device of the third embodiment, and FIG. 12B is a plan view thereof. A cross sectional view taken along one-dot chain line A12—A12 shown in FIG. 12B corresponds to FIG. 12A. Description will be made on different points from the semiconductor light emitting device of the first embodiment.

In the first embodiment, the n-side pad electrode 21 is disposed on the n-side ohmic electrode 11, whereas in the second embodiment, an n-side pad electrode 21 is disposed over a p-side ohmic electrode 10 and contacts a reflection film 16. A p-side pad electrode 20 and the n-side pad electrode 21 are exposed on the bottoms of openings 17a and 17b formed through a protective film 17.

As shown in FIG. 12B, the n-side ohmic electrode 11 is disposed along one side of a support substrate 1. The p-side pad electrode 20 is disposed near at one end of the side facing the side along which the n-side ohmic electrode 11 is disposed. The reflection film 16 occupies most of the area where the p-side pad electrode 20 is not disposed. The n-side pad electrode 21 occupies most of the area where the reflection film 16 superposes the p-side ohmic electrode 10.

Figure 13:
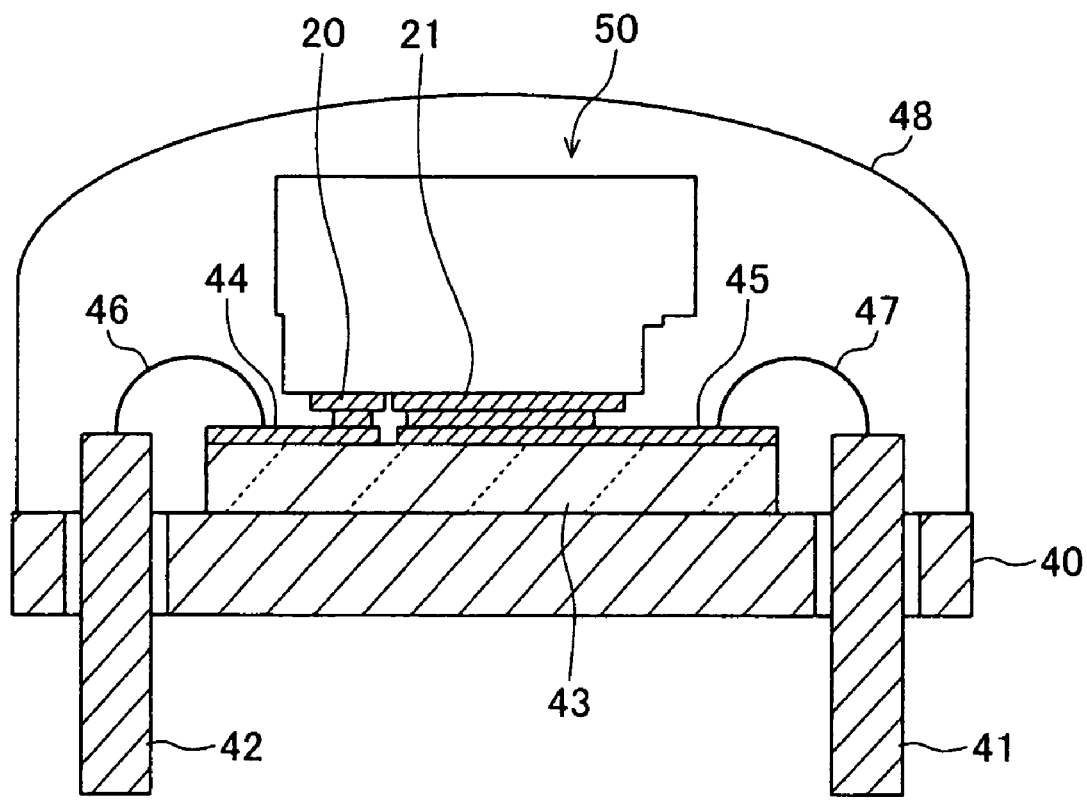
FIG. 13 is a schematic cross sectional view of a lamp having the semiconductor light emitting device of the third embodiment built therein.

FIG. 13 is a schematic cross sectional view of a lamp having the semiconductor light emitting device of the third embodiment built therein. The semiconductor light emitting device 50 of the third embodiment is flip-chip-bonded to a sub-mount substrate 43. The p-side pad electrode 20 and n-side pad electrode 21 of the semiconductor light emitting device 50 are connected to respective anode wiring 44 and cathode wiring 45 formed on the sub-mount substrate 43. The sub-mount substrate 43 is fixed to a stem 40. An anode lead 42 and a cathode lead 41 are fixed to the stem 40. The anode wiring 44 is connected to the anode lead 42 via a gold wire 46, and the cathode wiring 45 is connected to the cathode lead 41 via a gold wire 47.

The semiconductor light emitting device 50 and sub-mount substrate 43 are sealed with sealing resin 48. Light radiated in the luminous layer of the semiconductor light emitting device 50 is reflected by the reflection film 16 shown in FIG. 12A and transmits through the support substrate 1 and sealing resin 48 to be irradiated to an external.

In the semiconductor light emitting device of the third embodiment, the n-side pad electrode 21 occupies a broader area of the device surface, as compared to the semiconductor light emitting device of the first embodiment. Via this broad n-side pad electrode 21, heat generated in the device efficiently flows to the sub-mount substrate 43. A good heat radiation effect can therefore be retained.

Next, with reference to FIGS. 14A and 14B, a semiconductor light emitting device of the fourth embodiment will be described.

Figure 14A:
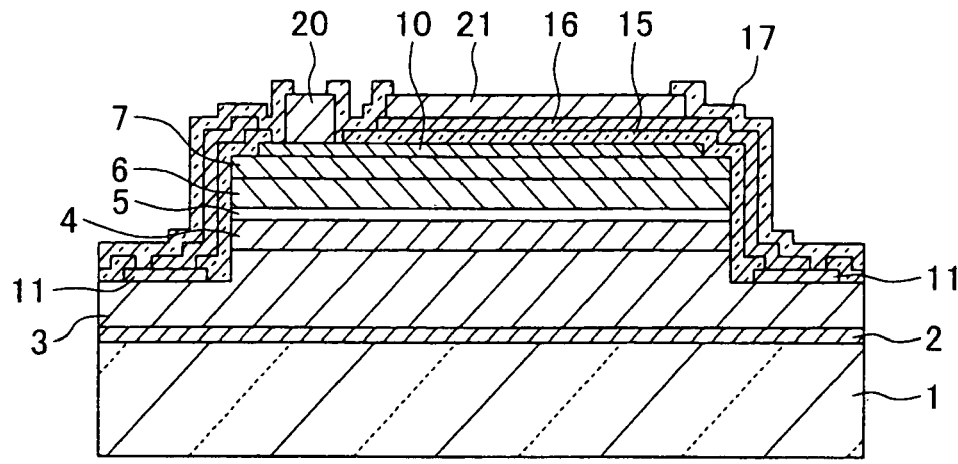
FIG. 14A is a cross sectional view of a semiconductor light emitting device according to a fourth embodiment.
Figure 14B:
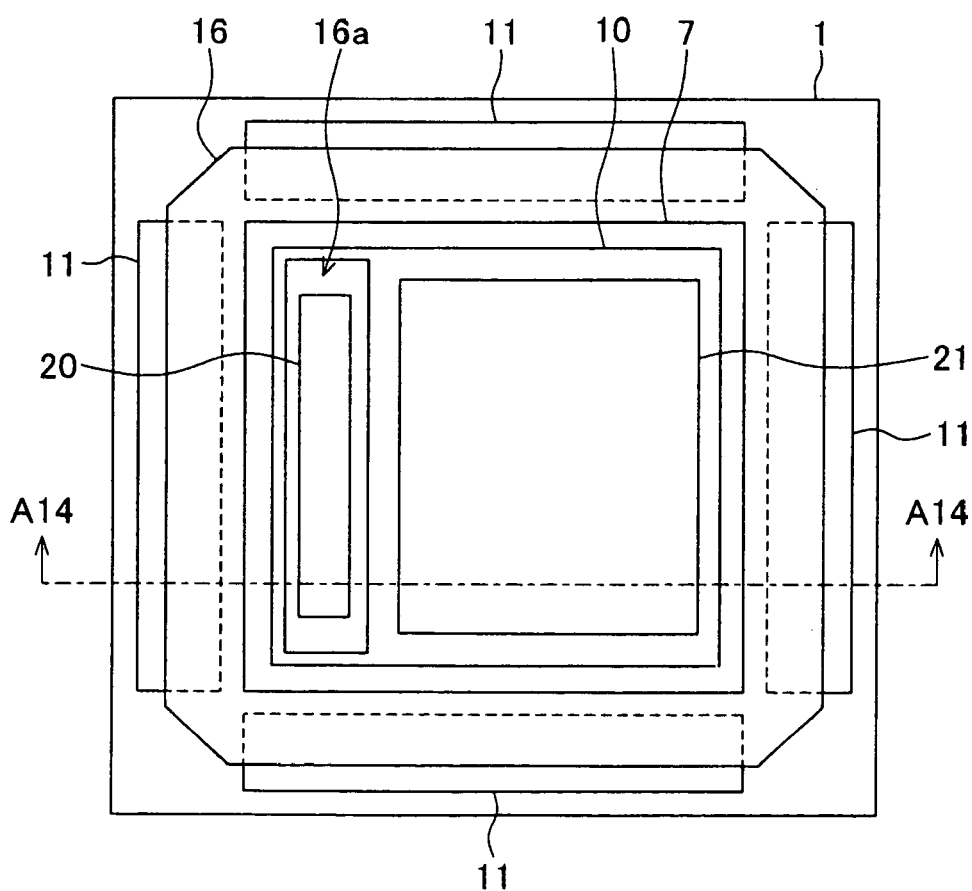
FIG. 14B is a plan view of the light emitting device of the fourth embodiment.

FIG. 14A is a cross sectional view of the semiconductor light emitting device of the fourth embodiment, and FIG. 14B is a plan view thereof. A cross sectional view taken along one-dot chain line A14—A14 shown in FIG. 14B corresponds to FIG. 14A. In the fourth embodiment, four n-side ohmic electrodes 11 are disposed along four sides of a support substrate 1 of a square shape. A reflection film 16 is connected to four n-side ohmic electrodes 11. An opening 16a is formed through the reflection film 16 in such a manner that a p-side pad electrode 20 exists in this opening. By forming this opening 16a, a short circuit between the reflection film 16 and p-side pad electrode 20 can be avoided.

In the fourth embodiment, since four n-side ohmic electrodes 11 are formed, a contact area of the electrodes can be broadened so that a contact resistance can be lowered. Since four n-side ohmic electrodes 11 are disposed along the four sides of the square, a current deviation in the substrate in-plane can be reduced.

The areas near the vertexes of the support substrate 1 are likely to be broken during device separation. It is therefore preferable that the n-side ohmic electrodes 11 are not extended near to the vertexes of the support substrate 1.

In the fourth embodiment, the whole side area of a mesa portion constituted of the lamination structure from the n-type clad layer 4 to p-type clad layer 7 is covered with the reflection film 16. It is therefore possible to efficiently reflect light irradiated from the luminous layer 5 toward the side portion, toward the support substrate 1 side and improve the light output efficiency. In order to further improve the light output efficiency, it is preferable to make the side wall of the mesa portion be inclined. For example, the inclination angle of the side wall of the mesa portion is preferably set to 60° or larger.

In the following, description will be made on an example of a method of inclining the side wall of the mesa portion. When a usual resist pattern is formed, exposure is performed under the condition that a photomask is made in contact with a resist film. If the side wall of the mesa portion is to be made inclined, exposure is performed under the condition that a photomask is slightly floated above a resist film. Since there is a gap between the resist film and the photomask, the edges of the pattern of the photomask are transferred unsharply. As the resist film is developed, a resist pattern having an inclined side wall can be obtained.

By using this resist pattern as an etching mask, a nitride semiconductor layer is dry-etched. Since the resist pattern is also gradually etched, the side wall of the mesa portion of the nitride semiconductor is made inclined in correspondence with the inclination of the side wall of the resist pattern.

Figure 15A:
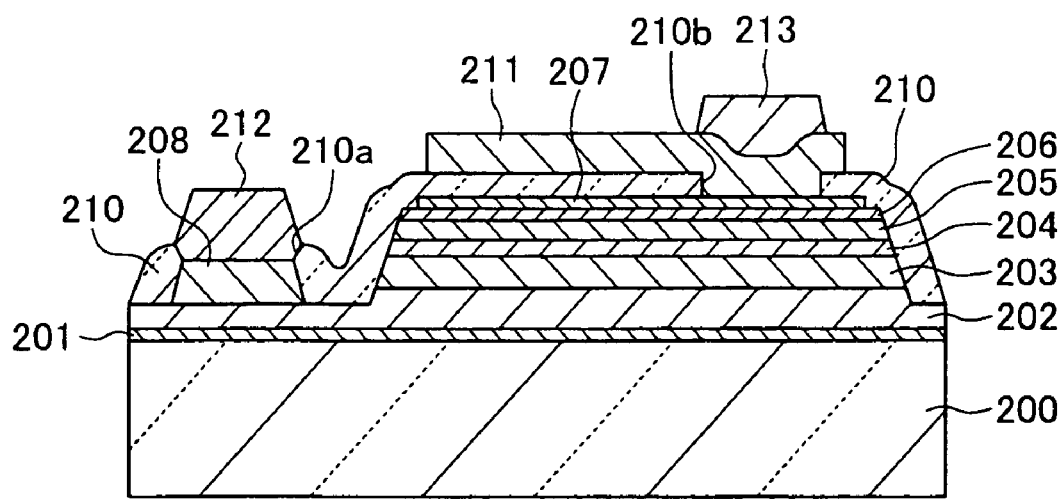
FIG. 15A is a cross sectional view of a conventional light emitting device using an Ag reflection film.
Figure 15B:
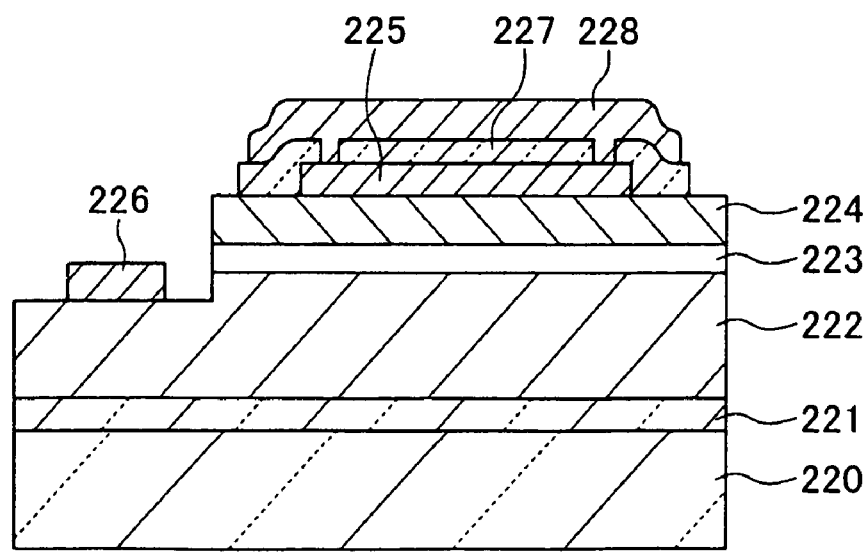
FIGS. 15B and 15C are cross sectional views of conventional semiconductor light emitting devices capable of suppressing Ag migration.
Figure 15C:
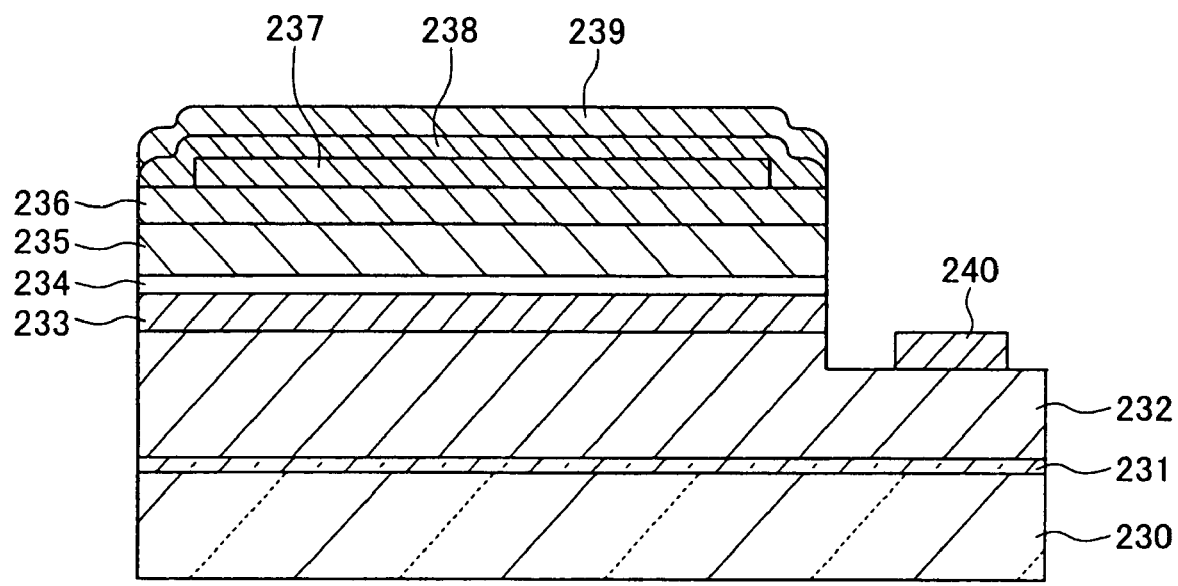

In the above-described embodiments, although the reflection film 16 is connected to the n-side ohmic electrode 11, the reflection film 16 may be made in a floating state by connecting it neither to the p-side ohmic electrode 10 nor to the n-side ohmic electrode 11. Also in the floating state, migration can be suppressed more than when the reflection film is connected to the anode as shown in FIGS. 15B and 15C.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor light emitting device comprising:
   a luminous lamination structure including a first layer made of n-type nitride semiconductor and a second layer made of p-type nitride semiconductor and disposed over the first layer, wherein a luminous region is defined between the first and second layers and the second layer is removed to expose the first layer in a first area which is a partial surface of the first layer;

a p-side electrode disposed on a surface of the second layer and electrically connected to the second layer;

an insulating film covering the p-side electrode;

an n-side electrode electrically connected to the first layer in the first area;

a reflection film disposed on the insulating film, extending to the n-side electrode, electrically connected to the n-side electrode, and made of a silver containing alloy or silver; and a conductive layer which is formed on a surface of the reflection film, and which is made of a metal having a larger ionization tendency than an ionization tendency of the reflection film.

2. A semiconductor light emitting device according to claim 1, wherein the p-side electrode transmits light having a luminescence wavelength of the luminous region.

3. A semiconductor light emitting device according to claim 1, wherein the p-side electrode is made of a metal selected from a group consisting of Pt, Rh and Pd, and has a thickness of 1 nm to 15 nm.

4. A semiconductor light emitting device according to claim 1, further comprising an intermediate layer disposed between the p-side electrode and the insulating film, the intermediate layer being made of at least a metal selected from a group consisting of Ti, Ni, W and Mo.

5. A semiconductor light emitting device according to claim 1, wherein the p-side electrode transmits light having a luminescence wavelength of the luminous region.

6. A semiconductor light emitting device according to claim 1, wherein the insulating film is made of at least a material selected from a group consisting of silicon oxide, titanium oxide, tantalum oxide, alumina, zirconium oxide, hafnium oxide, and insulating polymeric material.

7. A semiconductor light emitting device according to claim 1, further comprising an insulating protective film covering the reflection film.

8. A semiconductor light emitting device according to claim 7, wherein the protective film is made of at least a material selected from a group consisting of silicon oxide, titanium oxide, tantalum oxide, alumina, zirconium oxide, hafnium oxide, and insulating polymeric material.

9. A semiconductor light emitting device according to claim 7, further comprising an intermediate layer disposed between the reflection film and the protective film, the intermediate layer being made of at least a metal selected from a group consisting of Ti, Ni, Al, W and Mo.

10. A semiconductor light emitting device according to claim 1, further comprising:

a p-side pad for flip chip bonding disposed on a partial surface area of the p-side electrode; and an n-side pad for flip chip bonding disposed on a partial surface area of the n-side electrode.

11. A semiconductor light emitting device according to claim 1, further comprising:

a p-side pad for flip chip bonding disposed on a partial surface area of the p-side electrode; and an n-side pad for flip chip bonding disposed on a surface of the reflection film superposing the second layer.

12. A semiconductor light emitting device according to claim 1, wherein the reflection film has a plane shape which scatters light irradiated from the luminous region and propagating toward the reflection film, and the semiconductor light emitting device further comprises a fluorescent material member which produces fluorescence when light scattered by the reflection film becomes incident.

13. A semiconductor light emitting device comprising:

a luminous lamination structure including a first layer made of n-type nitride semiconductor and a second layer made of p-type nitride semiconductor and disposed over the first layer, wherein a luminous region is defined between the first and second layers and the second layer is removed to expose the first layer in a first area which is a partial surface of the first layer;

a p-side electrode disposed on a surface of the second layer, electrically connected to the second layer, and transmitting light irradiated from the luminous region;

an insulating film covering the p-side electrode;

an n-side electrode electrically connected to the first layer in the first area;

a reflection film disposed on the insulating film, extending to the n-side electrode, electrically connected to the n-side electrode, and which reflects light irradiated from the luminous region; and a conductive layer which is formed on a surface of the reflection film, and which is made of a metal having a larger ionization tendency than an ionization tendency of the reflection film.

14. A semiconductor light emitting device according to claim 13, wherein the p-side electrode is made of a metal selected from a group consisting of Pt, Rh and Pd, and has a thickness of 1 nm to 15 nm.

15. A semiconductor light emitting device comprising:

a luminous lamination structure including a first layer made of n-type nitride semiconductor and a second layer made of p-type nitride semiconductor and disposed over the first layer, wherein a luminous region is defined between the first and second layers and the second layer is removed to expose the first layer in a first area which is a partial surface of the first layer;

a p-side electrode disposed on a surface of the second layer and electrically connected to the second layer;

an insulating film covering the p-side electrode;

an n-side electrode electrically connected to the first layer in the first area;

a reflection film disposed on the insulating film, made of a silver containing alloy or silver, and made in an electrically floating state so as to be connected neither to the p-side electrode nor to the n-side electrode; and a conductive layer which is formed on a surface of the reflection film, and which is made of a metal having a larger ionization tendency than an ionization tendency of the reflection film.

16. A semiconductor light emitting device according to claim 15, wherein the p-side electrode transmits light having a luminescence wavelength of the luminous region.

17. A semiconductor light emitting device according to claim 15, wherein the p-side electrode is made of a metal selected from a group consisting of Pt, Rh and Pd, and has a thickness of 1 nm to 15 nm.

18. A semiconductor light emitting device according to claim 15, wherein the reflection film is disposed over the p-side electrode.

19. A semiconductor light emitting device comprising:

a luminous lamination structure including a first layer made of n-type nitride semiconductor and a second layer made of p-type nitride semiconductor and disposed over the first layer, wherein a luminous region is defined between the first and second layers and the second layer is removed to expose the first layer in a first area which is a partial surface of the first layer;

a p-side electrode disposed on a surface of the second layer, electrically connected to the second layer, and transmitting light irradiated from the luminous region;

an insulating film covering the p-side electrode;

an n-side electrode electrically connected to the first layer in the first area;

a reflection film disposed on the insulating film, made in an electrically floating state so as to be connected neither to the p-side electrode nor to the n-side electrode, and which reflects light irradiated from the luminous region; and a conductive layer which is formed on a surface of the reflection film, and which is made of a metal having a larger ionization tendency than an ionization tendency of the reflection film.

20. A semiconductor light emitting device according to claim 19, wherein the reflection film is disposed over the p-side electrode.

* * * * *